(12) United States Patent
Kawata et al.

(10) Patent No.: US 6,316,317 B1
(45) Date of Patent: Nov. 13, 2001

(54) NONVOLATILE SEMICONDUCTOR MEMORY DEVICE INCLUDING TWO-TRANSISTOR TYPE MEMORY CELLS AND ITS MANUFACTURING METHOD

(75) Inventors: Masato Kawata; Tsutomu Tashiro, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/526,419

(22) Filed: Mar. 15, 2000

(30) Foreign Application Priority Data

Mar. 15, 1999 (JP) .................................................. 11-067745

(51) Int. Cl.[7] .............................................. H01L 21/336
(52) U.S. Cl. ........................... 438/289; 438/236; 438/217
(58) Field of Search ................................... 438/236, 766, 438/765, 289, 217

(56) References Cited

U.S. PATENT DOCUMENTS

| | | | | |
|---|---|---|---|---|
| 4,329,773 | * | 5/1982 | Geipel, Jr. et al. | 29/571 |
| 4,945,068 | * | 7/1990 | Sugaya | 437/52 |
| 5,063,171 | * | 11/1991 | Gill | 437/41 |
| 5,330,920 | * | 7/1994 | Soleimani | 437/24 |
| 5,962,914 | * | 10/1999 | Gardner et al. | 257/607 |
| 5,963,839 | * | 10/1999 | Huang | 438/766 |

* cited by examiner

*Primary Examiner*—Vu A. Le
*Assistant Examiner*—Bradley Smith

(57) ABSTRACT

In a nonvolatile semiconductor memory device including a plurality of memory cells each formed by one selection transistor and one memory transistor connected in series, the thickness of a first gate insulating layer of the selection transistor is smaller than the thickness of a second gate insulating layer of the memory transistor.

13 Claims, 22 Drawing Sheets

NONVOLATILE SEMICONDUCTOR MEMORY DEVICE INCLUDING TWO-TRANSISTOR TYPE MEMORY CELLS AND ITS MANUFACTURING METHOD

BACKGROUND OF THE INVENTION

1. Field of the Invention

The present invention relates to a nonvolatile semiconductor memory device including two-transistor type memory cells and its manufacturing method.

2. Description of the Related Art

In a nonvolatile semiconductor memory device, a write operation can be carried out after the device is mounted on a printed circuit board. One typical example of such a device is a flash memory which has an advantage in that data storage is possible without a backup battery, and which is highly integrated. Generally, one memory cell of the flash memory is formed by a silicon substrate, a floating gate over a channel region of the substrate, and a control gate over the floating gate.

Recently, in order to increase an ON current flowing through the memory cell, two-transistor type memory cells have been developed. A prior art memory cell of this type is formed by one selection transistor and one memory transistor connected in series and controlled by voltages of a pair of word lines, and the thickness of a gate insulating layer of the selection transistor is the same as that of a gate insulating layer of the memory transistor. Also, the threshold voltage of the selection transistor is the same as that of the memory transistor where no charges are injected into a floating gate. This will be explained later in detail.

Generally, the thinner the gate insulating layer, the larger an ON current flowing through each of the selection transistor and the memory transistor. In the memory transistor, however, if the gate insulating layer is too thin, electrons accumulated in the floating gate are leaked through the gate insulating layer into the silicon substrate. Therefore, it is impossible to greatly reduce the thickness of the gate insulating layer for the memory transistor. On the other hand, in the selection transistor, since the floating gate is not provided, it is possible to greatly reduce the thickness of the gate insulating layer for the selection transistor.

Therefore, in the prior art memory cell, it is impossible for the gate insulating layer to be optimum both for the selection transistor and the memory transistor.

Further, if the threshold voltage of the memory transistor where no electrons are injected into the floating gate is too large, a read operation performed upon this memory transistor may invite a soft write operation, which is called a read disturb phenomenon. Therefore, in order to avoid this read disturb phenomenon, it is preferable that the threshold voltage of the memory transistor be smaller.

In the prior art memory cell, however, it is impossible to adjust the threshold voltage of the memory transistor, independent of the threshold voltage of the selection transistor.

SUMMARY OF THE INVENTION

It is an object of the present invention to provide a two-transistor type nonvolatile memory cell including a gate insulating having an optimum thickness both for a selection transistor and a memory transistor and a method for manufacturing such a memory cell.

Another object is to avoid the read disturb phenomenon in a two-transistor type nonvolatile memory cell.

According to the present invention, in a nonvolatile semiconductor memory device including a plurality of memory cells each formed by one selection transistor and one memory transistor connected in series, the thickness of a first gate insulating layer of the selection transistor is smaller than the thickness of a second gate insulating layer of the memory transistor.

Also, the threshold voltage of the selection transistor is different from the threshold voltage of the memory transistor where no charges are injected into a floating gate.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art nonvolatile semiconductor memory device will be explained with reference to FIGS. 1, 2, 3 and 4A through 4G.

Figure 1:
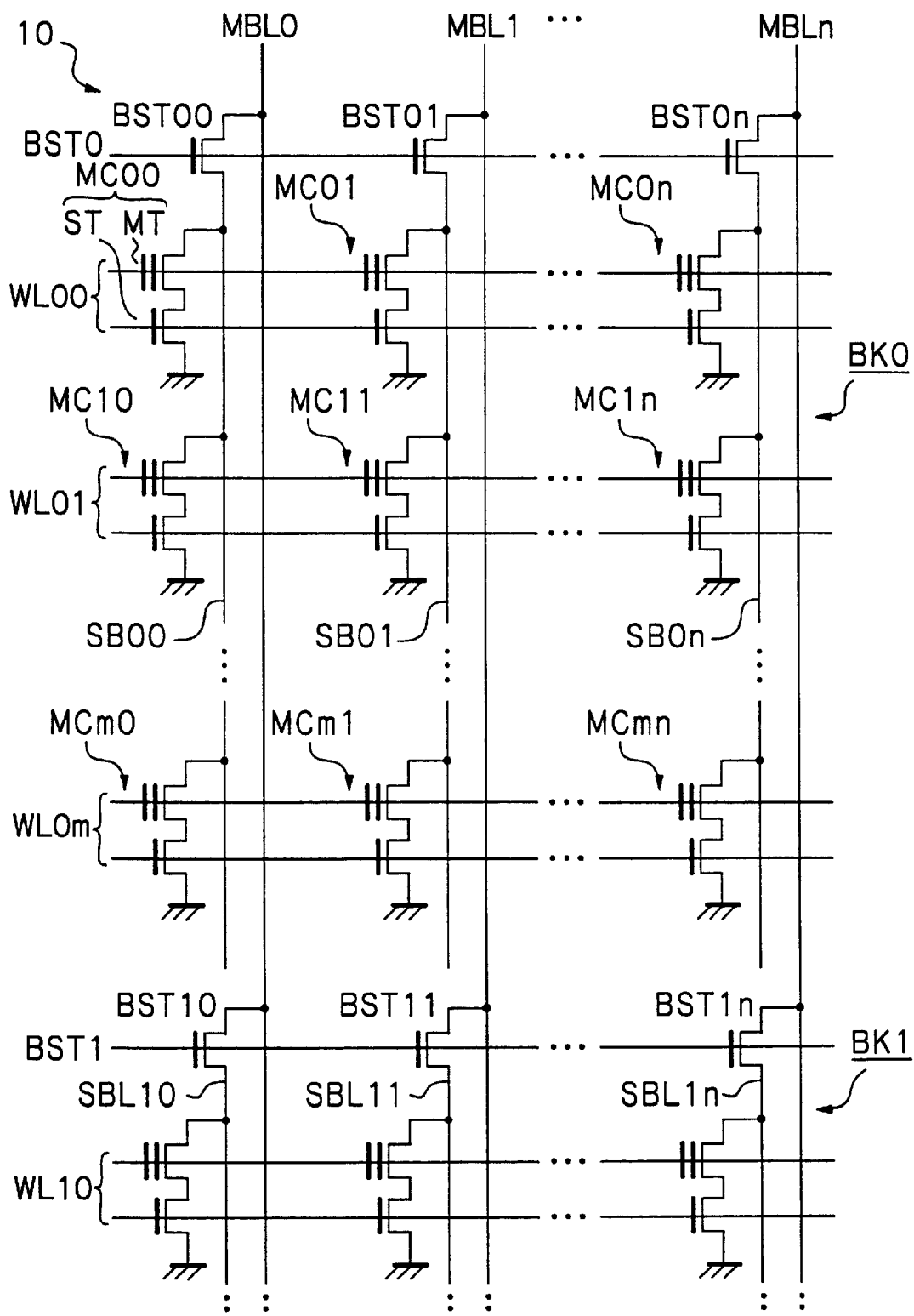
FIG. 1 is a circuit diagram illustrating a prior art nonvolatile semiconductor memory device.

In FIG. 1, which illustrates a prior art nonvolatile semiconductor memory device, the device is divided into a plurality of blocks BK0, BK1, . . . commonly having a plurality of main bit lines MBL0, MBL1, . . . , MBLn. Each of the blocks BK0, BK1, . . . is formed by word line pairs such as WL00, WL01, . . . , WL0m, sub bit lines such as SBL00, SBL01, . . . , SBL0n connected via block selection transistors such as BST00, BST01, . . . , BST0n to the main bit lines MBL0, MBL1, . . . , MBLn, respectively, and memory cells such as MC00 each connected to one of the word line pairs WL00, WL01, . . . , WL0m and one of the sub bit lines SBL00, SBL01, . . . , SBL0n. Each of the memory cells MCij includes a selection transistor ST and a memory transistor MT.

Figure 2:
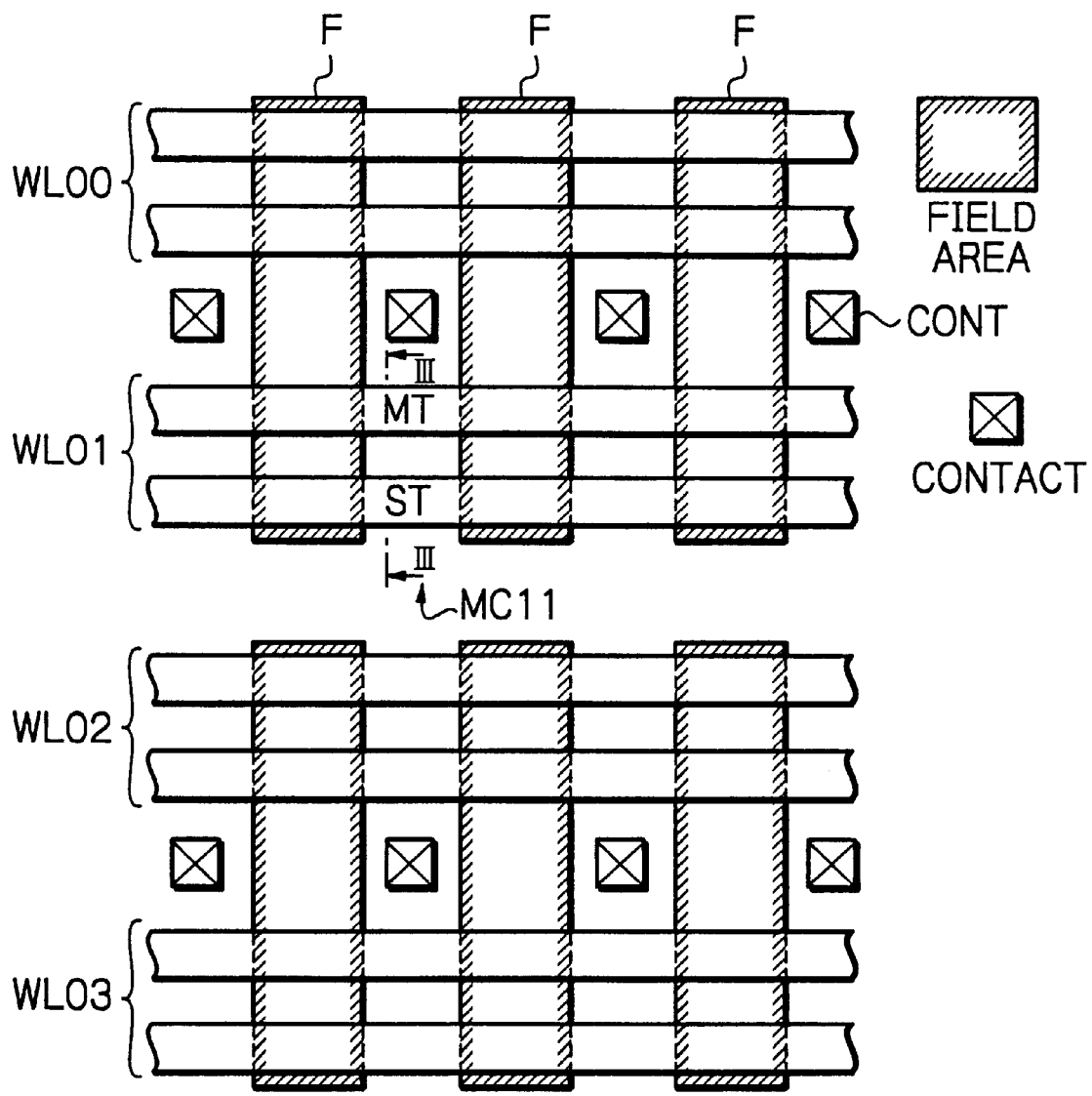
FIG. 2 is a plan view of the memory cells of FIG. 1.

In FIG. 2, which is a plan view of the memory cells MCij of FIG. 1, the memory cells MCij are partitioned by a field insulating layer formed in a field area F. Also, a drain region of the memory transistor MT of each memory cell is connected via a contact structure CONT to one of the sub bit lines (see FIG. 1), while the source regions of the selection transistors ST of the memory cells belonging to the same word line pair such as WL01 are connected to each other due to the absence of the field insulating layer therein and are grounded.

Figure 3:
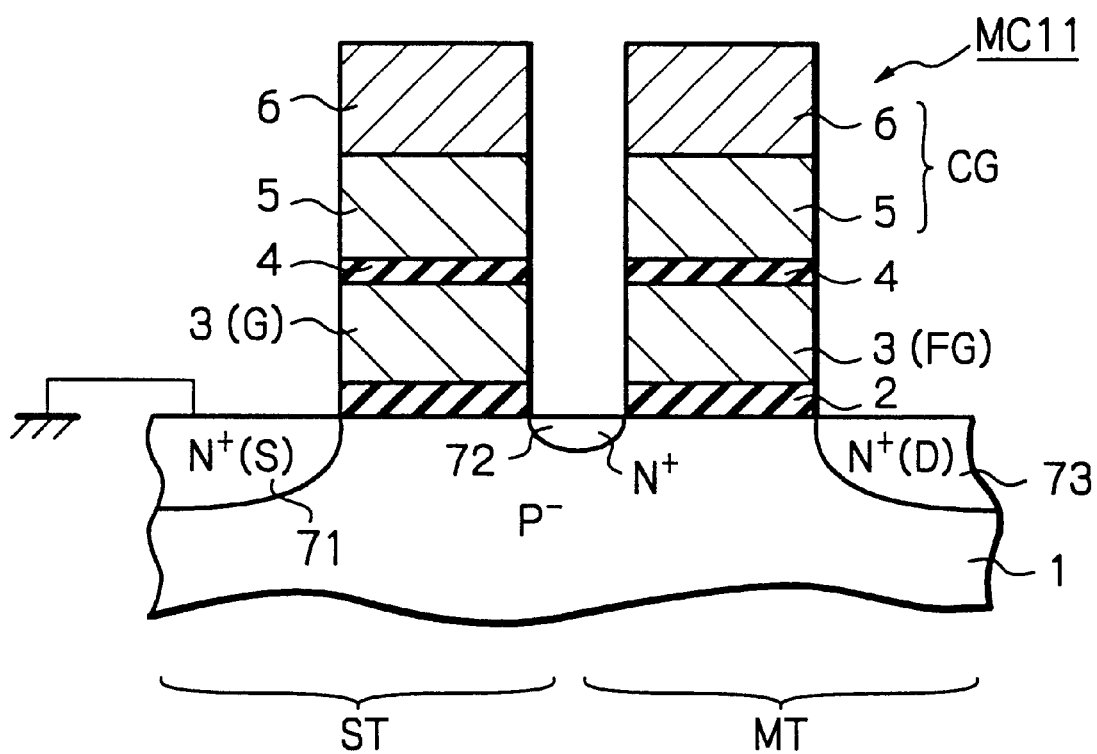
FIG. 3 is a cross-sectional view taken along the lines III—III of FIG. 2.

In FIG. 3, which is a cross-sectional view of the device taken along the lines III—III of FIG. 2, the memory cell MC11 includes a gate silicon oxide layer 2 formed on a P⁻-type silicon substrate 1, a polycrystalline silicon layer 3 formed on the gate silicon oxide layer 2, an insulating layer 4 made of silicon oxide/silicon nitride/silicon oxide (ONO) formed on the polycrystalline silicon layer 3, a polycrystalline silicon layer formed on the insulating layer 4 and a tungsten silicide (WSi) layer 6 formed on the polycrystalline silicon layer 5. Also, N⁺-type impurity regions, i.e., a source region 71, a diffusion region 72 and a drain region 73 are formed in the silicon substrate 1. Note that the source region 71 is grounded.

The selection transistor ST and the memory transistor MT have a similar configuration. However, in the selection transistor ST, the polycrystalline silicon layer 3 serves as a gate electrode G as well as one of the word line pair WL01. Therefore, the polycrystalline silicon layer 5 and the WSi layer 6 are not used for the selection transistor ST. On the other hand, in the memory transistor MT, the polycrystalline silicon layer 3 serves as a floating gate FG, and the polycrystalline silicon layer 5 and the WSi layer 6 serve as a control gate CG as well as one of the word line pair WL01.

The method for manufacturing the device of FIG. 3 will be explained next with reference to FIGS. 4A through 4G.

Figure 4A:
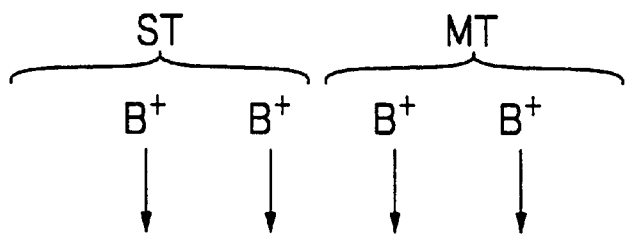
FIGS. 4A through 4G are cross-sectional views for explaining a method for manufacturing the device of FIG. 3.

First, referring to FIG. 4A, after a field silicon oxide layer (not shown) is grown on a P⁻-type silicon substrate 1 by a local oxidation of silicon (LOCOS) process, an about 20 nm thick through silicon oxide layer 11 is thermally grown by oxidizing the silicon substrate 1. Then, 2×10¹² boron ions (B⁺) per cm² are implanted at an energy of about 30 keV via the through silicon oxide layer 11 into the silicon substrate 1, in order to increase the threshold voltages of the selection transistor ST and the memory transistor MT. Then, the through silicon oxide layer 11 is removed.

Figure 4B:
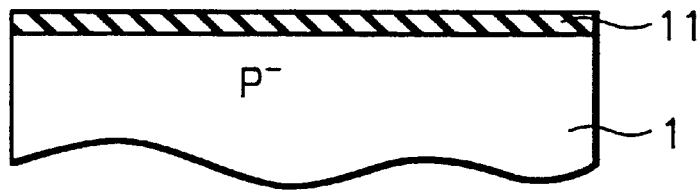

Next, referring to FIG. 4B, an about 8 nm thick gate silicon oxide layer (tunneling oxide layer) 2 is thermally grown by oxidizing the silicon substrate 1 at a temperature of 850° C.

Figure 4C:
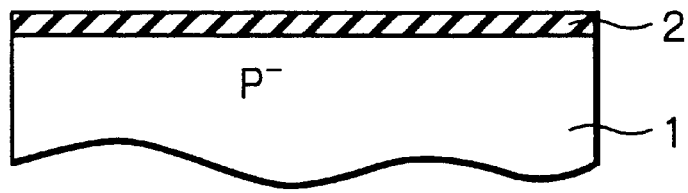

Next, referring to FIG. 4C, an about 150 nm thick polycrystalline silicon layer 3 is deposited on the gate silicon oxide layer 2 by a chemical vapor deposition (CVD) process. Then, about 5×10¹⁴ phosphorus ions (P⁺) per cm² are implanted at an energy of about 40 keV into the polycrystalline silicon layer 3.

Figure 4D:
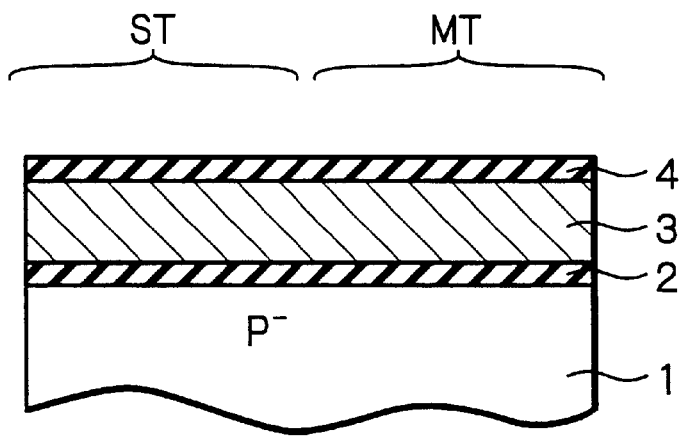

Next, referring to FIG. 4D, an insulating layer 4 made of ONO is deposited on the polycrystalline silicon layer 3 by a CVD process. In this case, the thickness of the insulating layer 4 corresponds to the thickness of about 17 nm of silicon oxide.

Figure 4E:
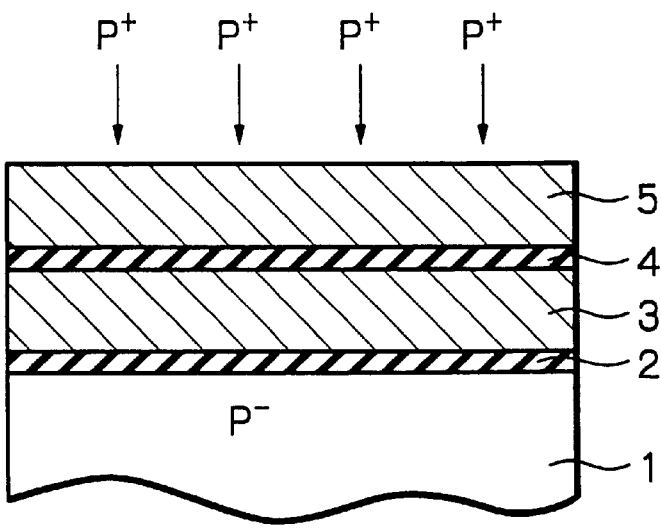

Next, referring to FIG. 4E, an about 150 nm thick polycrystalline silicon layer 5 is deposited on the insulating layer 4 by a CVD process. Then, phosphorus ions (P⁺) are diffused into the polycrystalline silicon layer 5, so that the resistance at the polycrystalline silicon layer 5 is about 40 Ω/□.

Figure 4F:
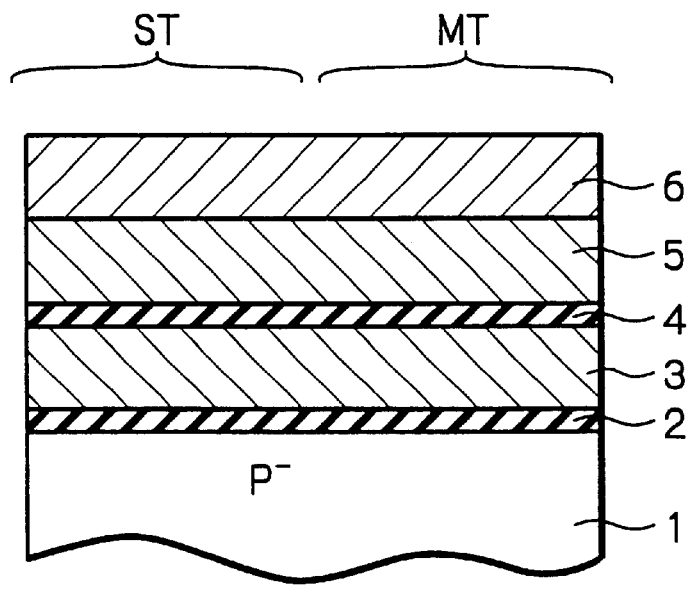

Next, referring to FIG. 4F, an about 150 nm thick WSi layer 6 is deposited on the polycrystalline silicon layer 5 by a sputtering process.

Figure 4G:
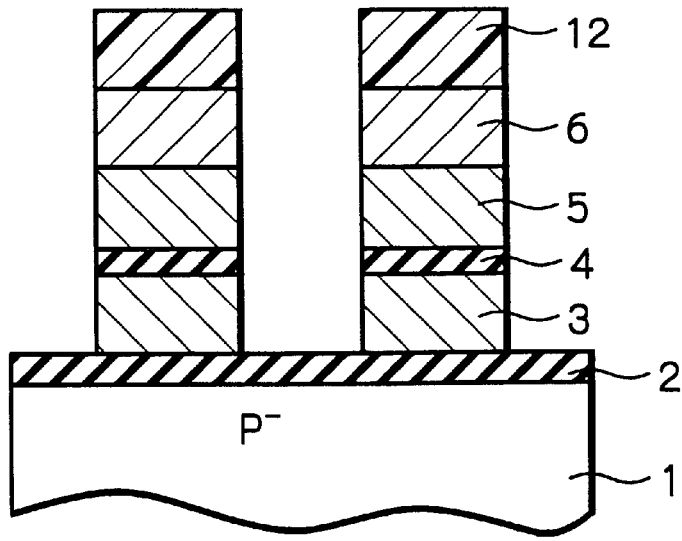

Finally, referring to FIG. 4G, a photoresist pattern 12 is formed by a photolithography process. Then, the WSi layer 6, the polycrystalline silicon layer 5, the insulating layer 4 and the polycrystalline silicon layer 3 are sequentially etched by using the photoresist pattern 12 as a mask. Then, the photoresist pattern 12 is removed.

After that, N-type impurity ions such as phosphorus ions (P⁺) or arsenic ions (As⁺) are implanted via the gate silicon oxide layer 2 into the silicon substrate 1 in self-alignment with the patterned layers of the WSi layer 6, the polycrystalline silicon layer 5, the insulating layer 4 and the polycrystalline silicon layer 3 so that the impurity regions 71, 72 and 73 are formed within the silicon substrate 1, thus obtaining the device of FIG. 3.

Note that, if the device of FIG. 3 is of a P-channel, at a step as illustrated in FIG. 4A, about 2×10¹² phosphorus ions per cm² are implaned at an energy of about 40 keV into the silicon substrate 1 which is, in this case, of an N⁻-type.

Figure 5:
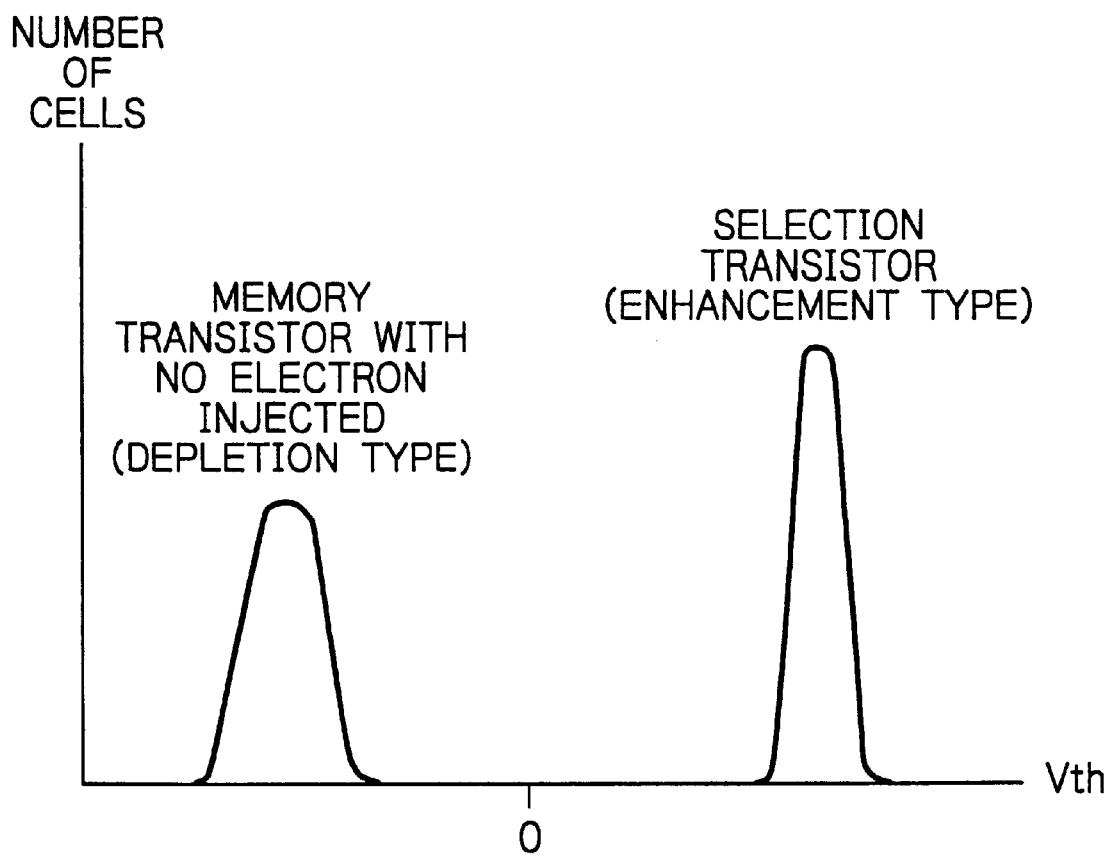
FIG. 5 is a graph showing threshold voltage characteristics of the memory transistor of FIG. 3.

In the memory device of FIG. 3, the amount of impurity ions such as boron ions at a process as illustrated in FIG. 4A is adjusted to cause the selection transistor ST to be of an enhancement type and cause the memory transistor MT to be also of an enhancement type where no electrons are injected into the floating gate FG. That is, generally, a drain current $I_d$ flowing through a MOS transistor is represented by $$I_d = (W/L) \cdot \mu_e \cdot C_{ox} \cdot ((V_{GS} - V_{th}) \cdot V_{DS} - (\tfrac{1}{2}) \cdot V_{DS}^2) \quad (1)$$

where W is a channel width;

L is a channel length;

$\mu_e$ is an electron mobility;

$C_{ox}$ is a capacitance of a gate insulating layer and is represented by $\epsilon \cdot S/d_{ox}$ ($\epsilon$ is a permittivity, S is an area, and $d_{ox}$ is a thickness);

$V_{GS}$ is a gate-to-source voltage;

$V_{DS}$ is a drain-to-source voltage; and $V_{th}$ is a threshold voltage. Therefore, if the memory transistor MT is of a depletion type where no electrons are injected into the floating gate FG as shown in FIG. 5, an ON current, i.e., the drain current $I_d$ flowing through the memory transistor MT is increased due to the negative value of the threshold voltage $V_{th}$. In this case, if the memory cell is not selected, the ON current flowing through the memory transistor MT is cut off by turning OFF the enhancement type selection transistor ST.

Also, from the equation (1), the thinner the gate silicon oxide layer 2, the larger an ON current flowing through each of the selection transistor ST and the memory transistor MT. In the memory transistor MT, however, if the gate silicon oxide layer 2 is too thin, electrons accumulated in the floating gate FG are leaked through the gate silicon oxide layer 2 into the silicon substrate 1. Therefore, it is impossible to greatly reduce the thickness of the gate silicon oxide layer 2 for the memory transistor MT. On the other hand, in the selection transistor ST, since the floating gate FG is not provided, it is possible to greatly reduce the thickness of the gate silicon oxide layer 2 for the selection transistor ST.

In the memory cell of FIG. 3, however, since the gate silicon oxide layer 2 has the same thickness for the selection transistor ST and the memory transistor MT, it is impossible for the gate silicon oxide layer 2 to be optimum both for the selection transistor ST and the memory transistor MT.

Further, if the threshold voltage of the memory transistor MT where no electrons are injected into the floating gate FG is too large, a read operation performed upon this memory transistor MT may invite a soft write operation, which is called a read disturb phenomenon. Therefore, in order to avoid this read disturb phenomenon, it is preferable that the threshold voltage of the memory transistor MT be smaller. Further, it is preferable that the memory transistor MT be of a depletion type where no electrons are injected into the floating gate FG as shown in FIG. 5.

In the memory cell of FIG. 3, however, since the implantation of impurity ions for adjusting the threshold voltages as illustrated in FIG. 4A is carried out commonly for the selection transistor ST and the memory transistor MT, it is impossible to adjust the threshold voltage of the memory transistor MT, independent of the threshold voltage of the selection transistor ST.

A first embodiment of the method for manufacturing a nonvolatile semiconductor device according to the present invention will be explained next with reference to FIGS. 6A through 6H.

Figure 6A:
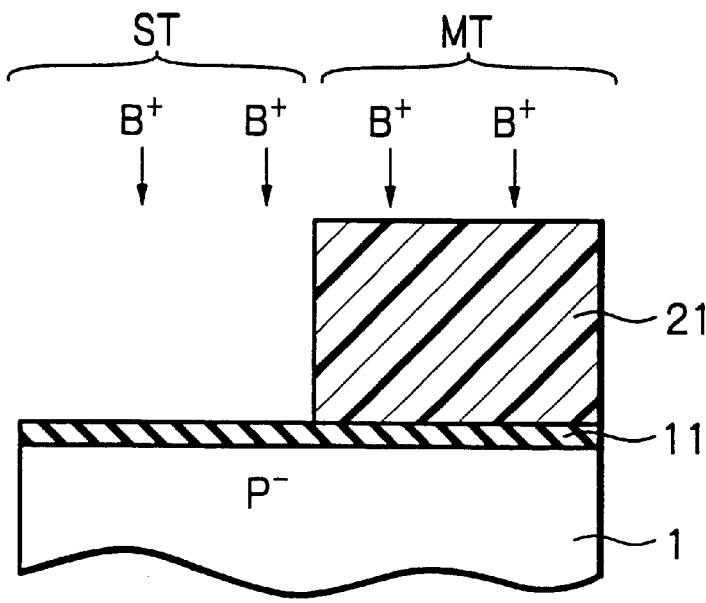
FIGS. 6A through 6H are cross-sectional views for explaining a first embodiment of the method for manufacturing a nonvolatile semiconductor memory device according to the present invention.

First, referring to FIG. 6A, after a field silicon oxide layer (not shown) is grown on a P$^-$-type silicon substrate 1 by a LOCOS process, an about 20 nm thick through silicon oxide layer 11 is thermally grown by oxidizing the silicon substrate 1. Then, a photoresist pattern 21 is formed only on the area of the memory transistor MT. Then, $2 \times 10^{12}$ boron ions (B$^+$) per cm$^2$ are implanted at an energy of about 30 keV via the through silicon oxide layer 11 into the silicon substrate 1 by using the photoresist pattern 21 as a mask, in order to increase the threshold voltage of the selection transistor ST. Then, the photoresist pattern 21 and the through silicon oxide layer 11 are removed.

Figure 6B:
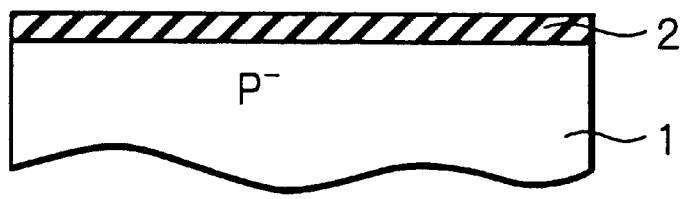

Next, referring to FIG. 6B, in the same way as in FIG. 4B, an about 8 nm thick gate silicon oxide layer (tunneling oxide layer) 2 is thermally grown by oxidizing the silicon substrate 1 at a temperature of about 850° C.

Figure 6C:
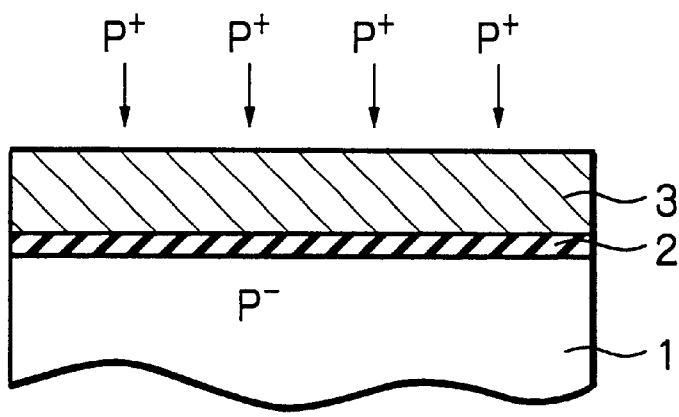

Next, referring to FIG. 6C, in the same way as in FIG. 4C, an about 150 nm thick polycrystalline silicon layer 3 is deposited on the gate silicon oxide layer 2 by a CVD process. Then, about $5 \times 10^{14}$ phosphorus ions (P$^+$) per cm$^2$ are implanted at an energy of about 40 keV into the polycrystalline silicon layer 3.

Figure 6D:
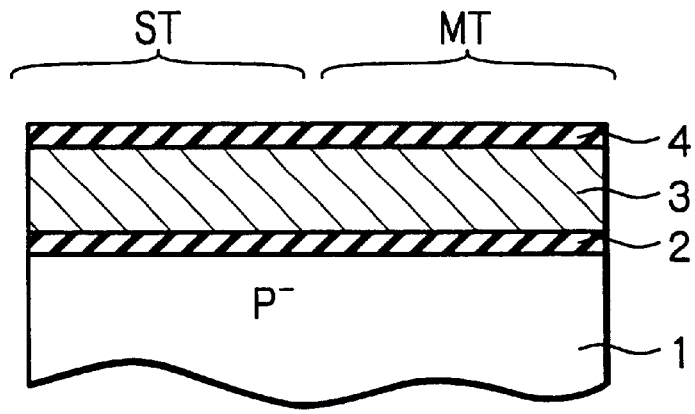

Next, referring to FIG. 6D, in the same way as in FIG. 4D, an insulating layer 4 made of ONO is deposited on the polycrystalline silicon layer 3 by a CVD process. In this case, the thickness of the insulating layer 4 corresponds to the thickness of about 17 nm of silicon oxide.

Figure 6E:
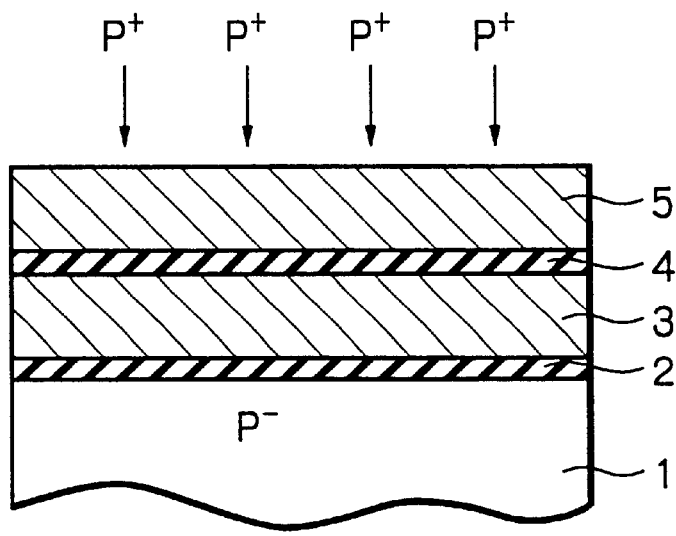

Next, referring to FIG. 6E, in the same way as in FIG. 4E, an about 150 nm thick polycrystalline silicon layer 5 is deposited on the insulating layer 4 by a CVD process. Then, phosphorus ions (P$^+$) are diffused into the polycrystalline silicon layer 5, so that the resistance at the polycrystalline silicon layer 5 is about 40 Ω/□.

Figure 6F:
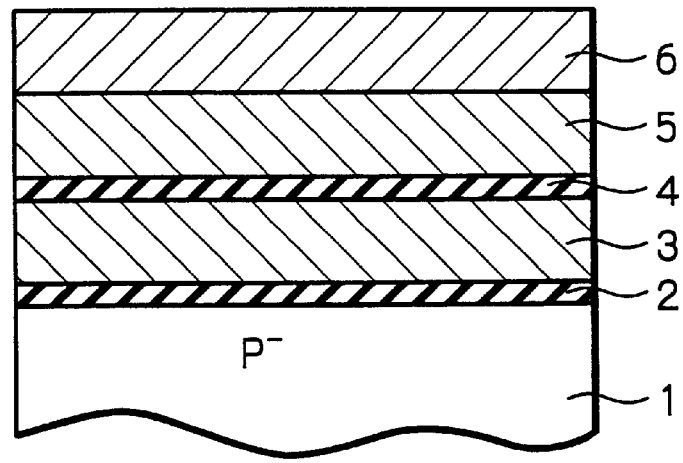

Next, referring to FIG. 6F, in the same way as in FIG. 4F, an about 150 nm thick WSi layer 6 is deposited on the polycrystalline silicon layer 5 by a sputtering process.

Figure 6G:
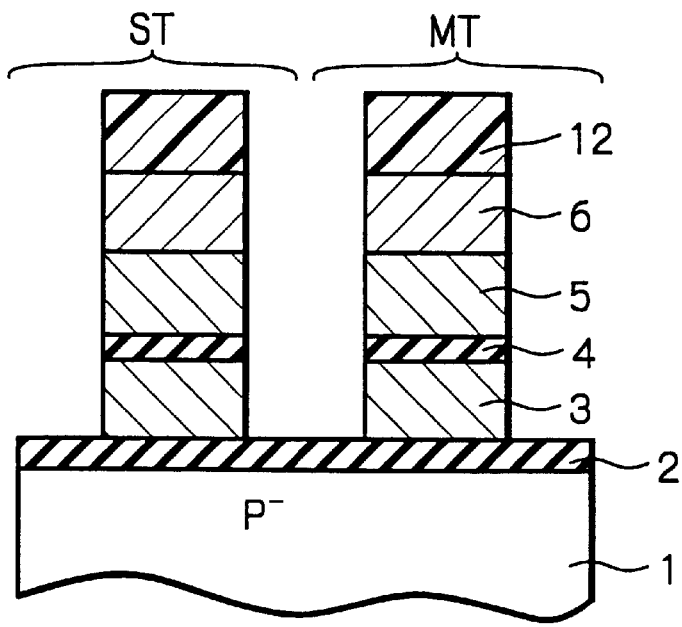

Next, referring to FIG. 6G, in the same way as in FIG. 4G, a photoresist pattern 12 is formed by a photolithography process. Then, the WSi layer 6, the polycrystalline silicon layer 5, the insulating layer 4 and the polycrystalline silicon layer 3 are sequentially etched by using the photoresist pattern 12 as a mask. Then, the photoresist pattern 12 is removed.

Figure 6H:
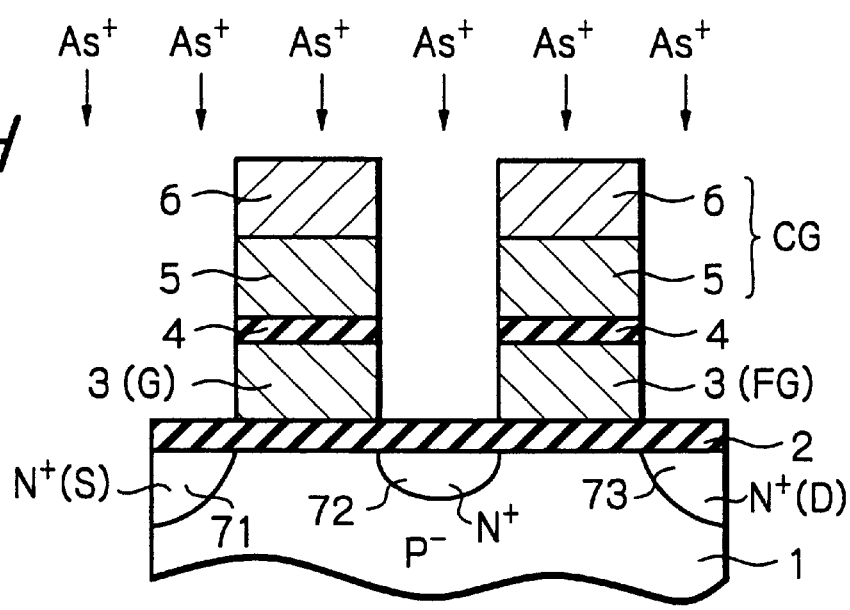

Finally, referring to FIG. 6H, N-type impurity ions such as phosphorus ions (P$^+$) or arsenic ions (As$^+$) are implanted via the gate silicon oxide layer 2 into the silicon substrate 1 in self-alignment with the patterned layers of the WSi layer 6, the polycrystalline silicon layer 5, the insulating layer 4 and the polycrystalline silicon layer 3, so that the impurity regions 71, 72 and 73 are formed within the silicon substrate 1, thus completing the device.

In the first embodiment as illustrated in FIGS. 6A through 6H, since the implantation of impurity ions for increasing the threshold voltages as illustrated in FIG. 6A is carried out only for the selection transistor ST, it is possible to adjust the threshold voltage of the memory transistor MT independent of the threshold voltage of the selection transistor ST. In this case, since no impurity ions are injected into the silicon substrate 1 in the area of the memory transistor MT, the threshold voltage of the memory transistor MT where no electrons are injected into the floating gate FG can be small, thus avoiding the read disturb phenomenon.

A second embodiment of the method for manufacturing a nonvolatile semiconductor device according to the present invention will be explained next with reference to FIGS. 7A through 7H.

Figure 7A:
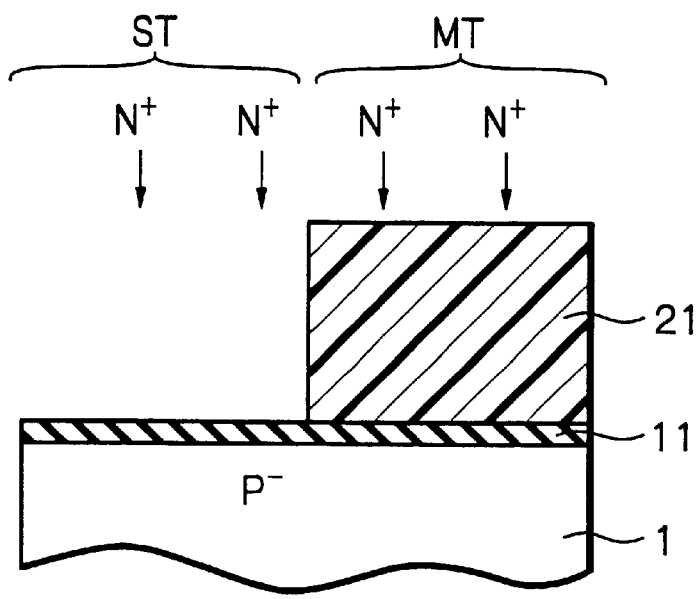
FIGS. 7A through 7H are cross-sectional views for explaining a second embodiment of the method for manufacturing a nonvolatile semiconductor memory device according to the present invention.

First, referring to FIG. 7A, after a field silicon oxide layer (not shown) is grown on a P$^-$-type silicon substrate 1 by a LOCOS process, an about 20 nm thick through silicon oxide layer It is thermally grown by oxidizing the silicon substrate 1. Then, a photoresist pattern 21 is formed only on the area of the memory transistor MT. Then, $5 \times 10^{14}$ nitrogen ions (N$^+$) per cm$^2$ are implanted at an energy of about 40 keV via the through silicon oxide layer 11 into the silicon substrate 1 by using the photoresist pattern 21 as a mask, in order to suppress the growth rate of silicon oxide on the area of the selection transistor ST. Then, the photoresist pattern 21 and the through silicon oxide layer 11 are removed.

Figure 7B:
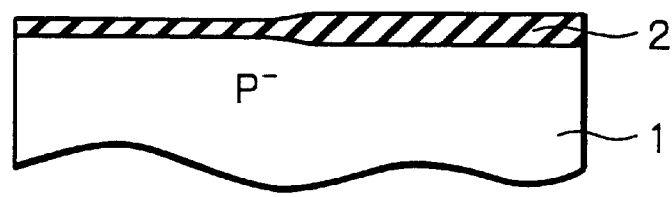

Next, referring to FIG. 7B, a gate silicon oxide layer (tunneling oxide layer) 2 is thermally grown by oxidizing the silicon substrate 1 at a temperature of about 850° C. In this case, the gate silicon oxide layer 2 is about 8 nm thick in the area of the memory transistor MT. On the other hand, the gate silicon oxide layer 2 is about 6 nm thick in the area of the selection transistor ST due to the implantation of nitrogen into the silicon substrate 1.

Figure 7C:
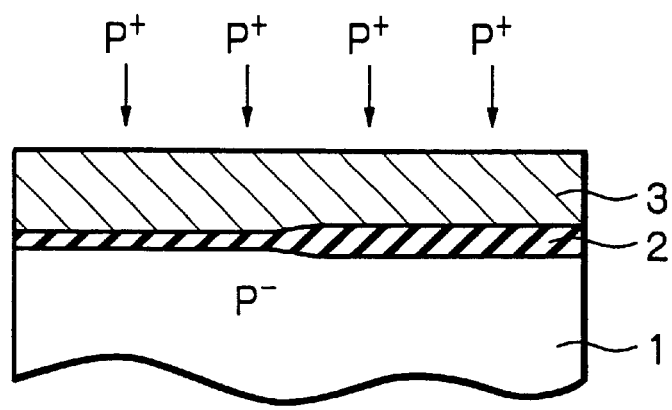

Next, referring to FIG. 7C, in the same way as in FIG. 4C, an about 150 nm thick polycrystalline silicon layer 3 is deposited on the gate silicon oxide layer 2 by a CVD process. Then, about $5 \times 10^{14}$ phosphorus ions (P$^+$) per cm$^2$ are implanted at an energy of about 40 keV into the polycrystalline silicon layer 3.

Figure 7D:
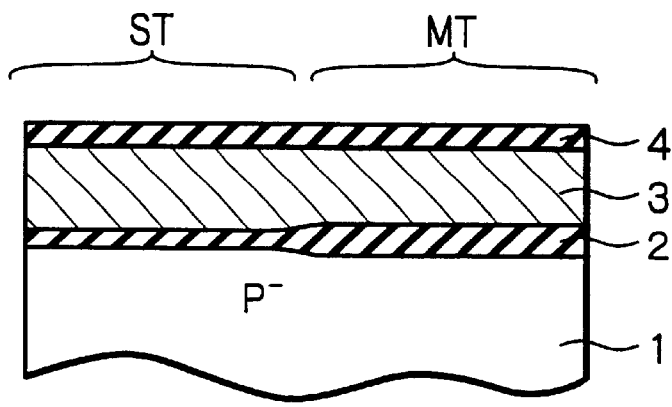

Next, referring to FIG. 7D, in the same way as in FIG. 4D, an insulating layer 4 made of ONO is deposited on the polycrystalline silicon layer 3 by a CVD process. In this case, the thickness of the insulating layer 4 corresponds to the thickness of about 17 nm of silicon oxide.

Figure 7E:
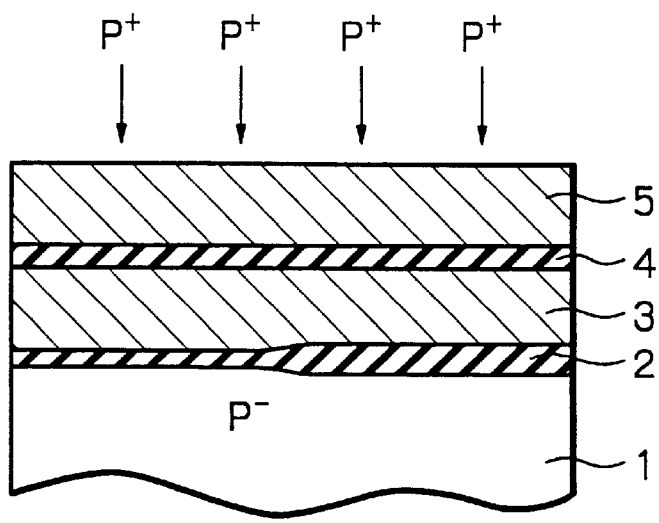

Next, referring to FIG. 7E, in the same way as in FIG. 4E, an about 150 nm thick polycrystalline silicon layer 5 is deposited on the insulating layer 4 by a CVD process. Then, phosphorus ions (P$^+$) are diffused into the polycrystalline silicon layer 5, so that the resistance at the polycrystalline silicon layer 5 is about 40 Ω/□.

Figure 7F:
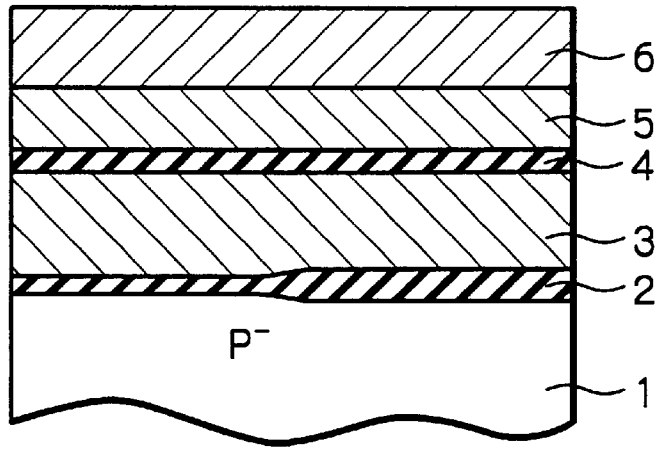

Next, referring to FIG. 7F, in the same way as in FIG. 4F, an about 150 nm thick WSi layer 6 is deposited on the polycrystalline silicon layer 5 by a sputtering process.

Figure 7G:
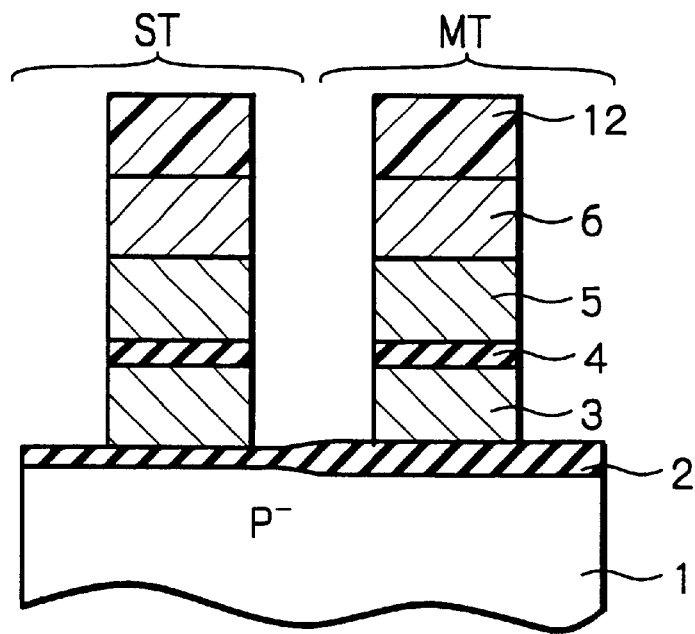

Next, referring to FIG. 7G, in the same way as in FIG. 4G, a photoresist pattern 12 is formed by a photolithography process. Then, the WSi layer 6, the polycrystalline silicon layer 5, the insulating layer 4 and the polycrystalline silicon layer 3 are sequentially etched by using the photoresist pattern 12 as a mask. Then, the photoresist pattern 12 is removed.

Figure 7H:
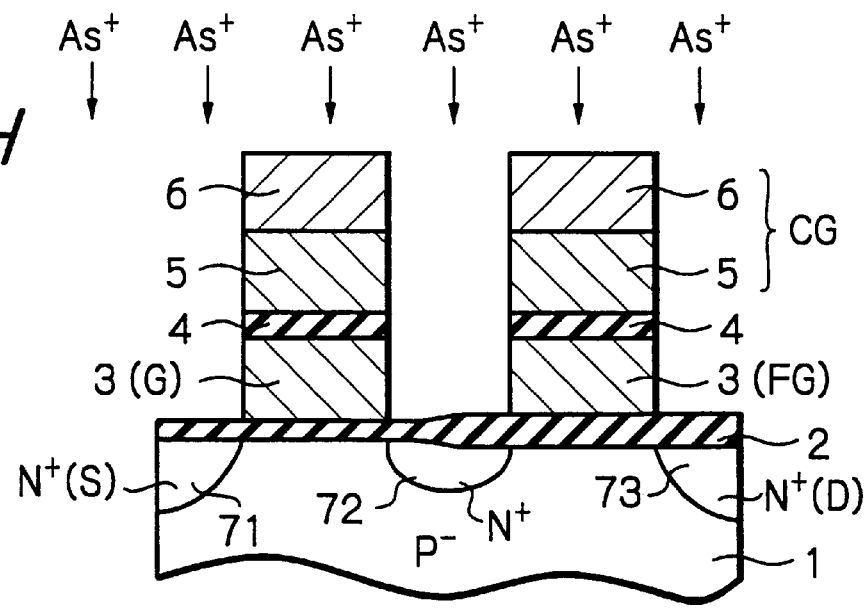

Finally, referring to FIG. 7H, in the same way as in FIG. 6H, N-type impurity ions such as phosphorus ions (P$^+$) or arsenic ions (As$^+$) are implanted via the gate silicon oxide layer 2 into the silicon substrate 1 in self-alignment with the patterned layers of the WSi layer 6, the polycrystalline silicon layer 5, the insulating layer 4 and the polycrystalline silicon layer 3 so that the impurity regions 71, 72 and 73 are formed within the silicon substrate 1, thus completing the device.

In the second embodiment as illustrated in FIGS. 7A through 7H, since the gate silicon oxide layer 2 has a reduced thickness for the selection transistor ST, it is possible for the gate silicon oxide layer 2 to be optimum both for the selection transistor ST and the memory transistor MT.

A third embodiment of the method for manufacturing a nonvolatile semiconductor device according to the present invention will be explained next with reference to FIGS. 8A through 8I.

Figure 8A:
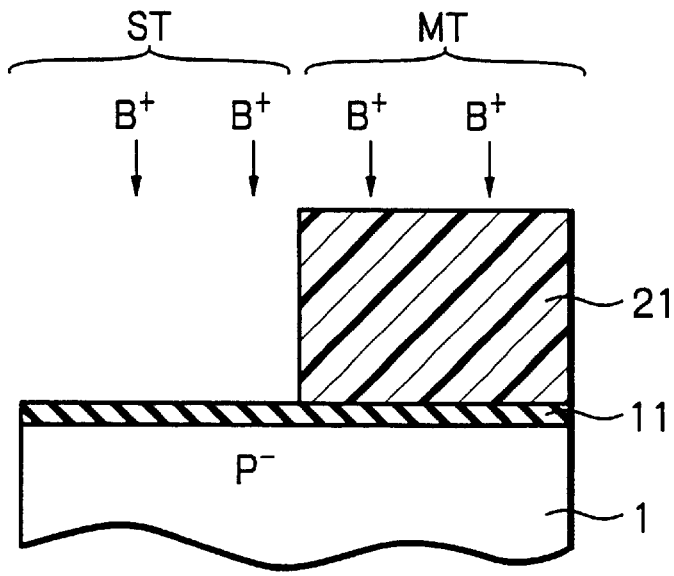
FIGS. 8A through 8I are cross-sectional views for explaining a third embodiment of the method for manufacturing a nonvolatile semiconductor memory device according to the present invention.

First, referring to FIG. 8A, in the same way as in FIG. 6A, after a field silicon oxide layer (not shown) is grown on a P$^-$-type silicon substrate 1 by a LOCOS process, an about 20 nm thick through silicon oxide layer 11 is thermally grown by oxidizing the silicon substrate 1. Then, a photoresist pattern 21 is formed only on the area of the memory transistor MT. Then, $2\times10^{12}$ boron ions (B$^+$) per cm$^2$ are implanted at an energy of about 30keV via the through silicon oxide layer 11 into the silicon substrate 1 by using the photoresist pattern 21 as a mask, in order to increase the threshold voltage of the selection transistor ST.

Figure 8B:
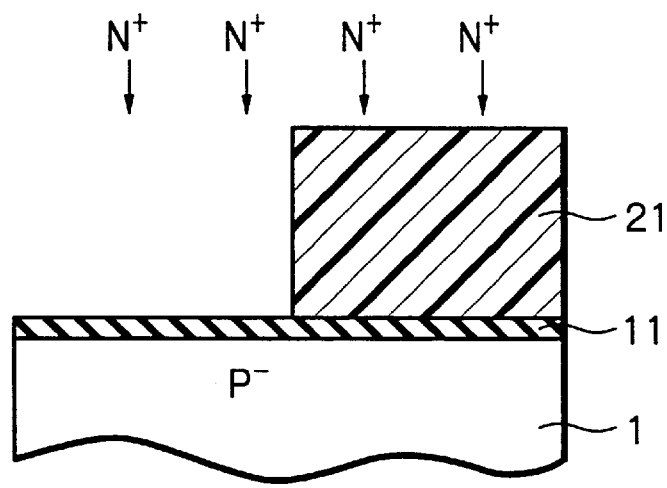

Next, referring to FIG. 8B, in the same way as in FIG. 7A, $5\times10^{14}$ nitrogen ions (N$^+$) per cm$^2$ are implanted at an energy of about 40 keV via the through silicon oxide layer 11 into the silicon substrate 1 by using the photoresist pattern 21 as a mask, in order to suppress the growth rate of silicon oxide on the area of the selection transistor ST. Then, the photoresist pattern 21 and the through silicon oxide layer 11 are removed.

Note that the implantation of nitrogen ions can be carried out before that of boron ions.

Figure 8C:
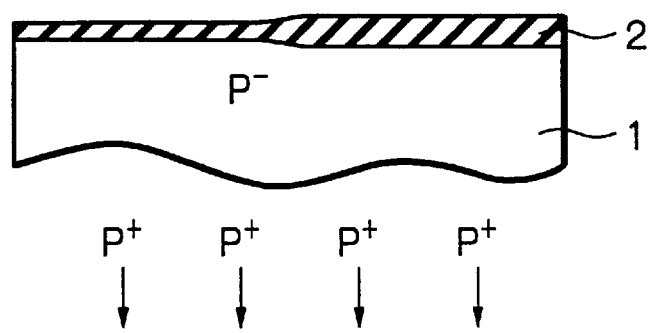

Next, referring to FIG. 8C, in the same way as in FIG. 7B, a gate silicon oxide layer (tunneling oxide layer) 2 is thermally grown by oxidizing the silicon substrate 1 at a temperature of about 850° C. In this case, the gate silicon oxide layer 2 is about 8 nm thick in the area of the memory transistor MT. On the other hand, the gate silicon oxide layer 2 is about 6 nm thick in the area of the selection transistor ST due to the implantation of nitrogen into the silicon substrate 1.

Figure 8D:
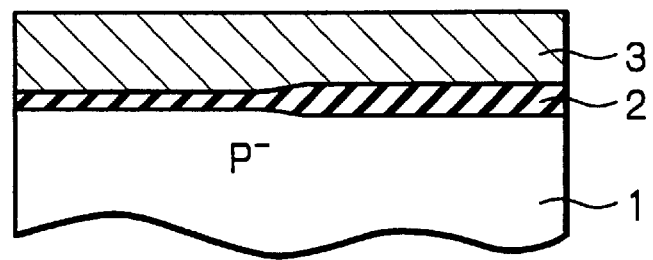

Next, referring to FIG. 8D, in the same way as in FIG. 7C, an about 150 nm thick polycrystalline silicon layer 3 is deposited on the gate silicon oxide layer 2 by a CVD process. Then, about $5\times10^{14}$ phosphorus ions (P$^+$) per cm$^2$ are implanted at an energy of about 40 keV into the polycrystal line silicon layer 3.

Figure 8E:
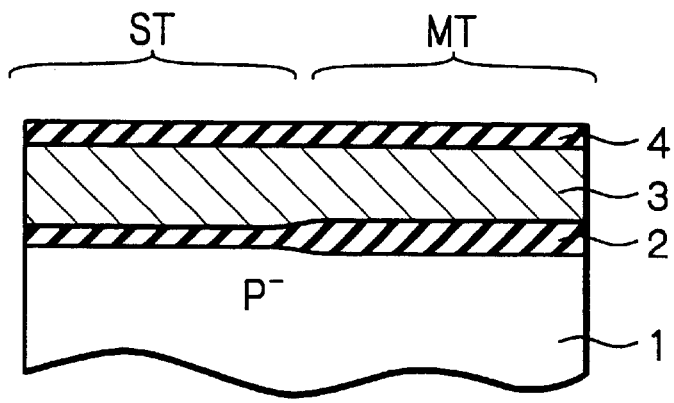

Next, referring to FIG. 8E, in the same way as in FIG. 7D, an insulating layer 4 made of ONO is deposited on the polycrystalline silicon layer 3 by a CVD process. In this case, the thickness of the insulating layer 4 corresponds to the thickness of about 17 nm of silicon oxide.

Figure 8F:
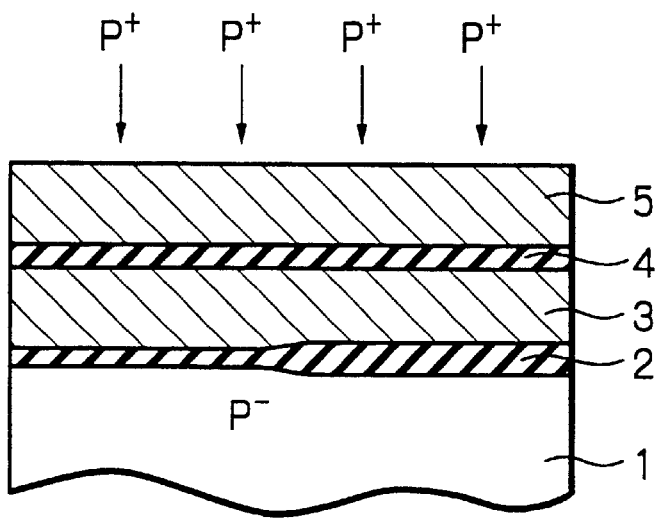

Next, referring to FIG. 8F, in the same way as in FIG. 7E, an about 150 nm thick polycrystalline silicon layer 5 is deposited on the insulating layer 4 by a CVD process. Then, phosphorus ions (P$^+$) are diffused into the polycrystalline silicon layer 5, so that the resistance at the polycrystalline silicon layer 5 is about 40 Ω/□.

Figure 8G:
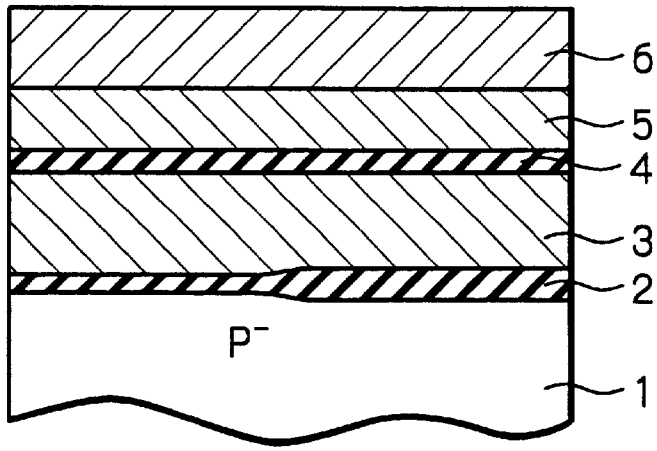

Next, referring to FIG. 8G, in the same way as in FIG. 7F, an about 150 nm thick WSi layer 6 is deposited on the polycrystalline silicon layer 5 by a sputtering process.

Figure 8H:
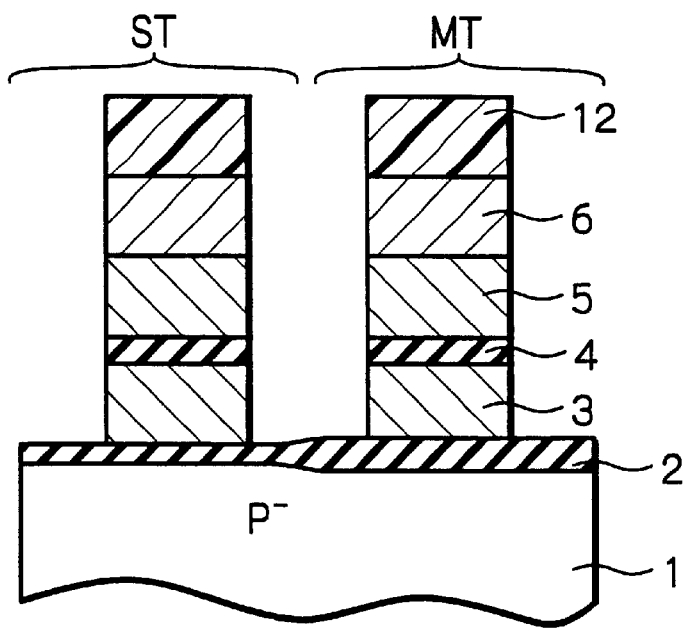

Next, referring to FIG. 8H, in the same way as in FIG. 7G, a photoresist pattern 12 is formed by a photolithography process. Then, the WSi layer 6, the polycrystalline silicon layer 5, the insulating layer 4 and the polycrystalline silicon layer 3 are sequentially etched by using the photoresist pattern 12 as a mask. Then, the photoresist pattern 12 is removed.

Figure 8I:
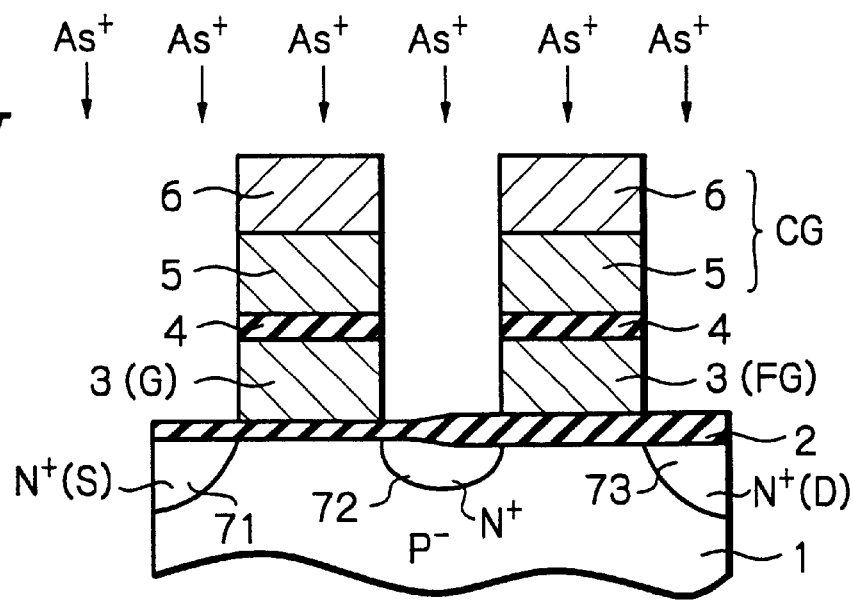

Finally, referring to FIG. 8I, in the same way as in FIG. 7H, N-type impurity ions such as phosphorus ions (P$^+$) or arsenic ions (As$^+$) are implanted via the gate silicon oxide layer 2 into the silicon substrate 1 in self-alignment with the patterned layers of the WSi layer 6, the polycrystalline silicon layer 5, the insulating layer 4 and the polycrystalline silicon layer 3 so that the impurity regions 71, 72 and 73 are formed within the silicon substrate 1, thus completing the device.

In the third embodiment as illustrated in FIGS. 8A through 8I, since the gate silicon oxide layer 2 has a reduced thickness for the selection transistor ST, it is possible for the gate silicon oxide layer 2 to be optimum both for the selection transistor ST and the memory transistor MT.

In addition, since the implantation of impurity ions for increasing the threshold voltages as illustrated in FIG. 8A is carried out only for the selection transistor ST, it is possible to adjust the threshold voltage of the memory transistor MT, independent of the threshold voltage of the selection transistor ST. In this case, since no boron ions are injected into the silicon substrate 1 in the area of the memory transistor MT, the threshold voltage of the memory transistor MT where no electrons are injected into the floating gate FG can be small, thus avoiding the read disturb phenomenon.

A fourth embodiment of the method for manufacturing a nonvolatile semiconductor device according to the present invention will be explained next with reference to FIGS. 9A through 9H.

Figure 9A:
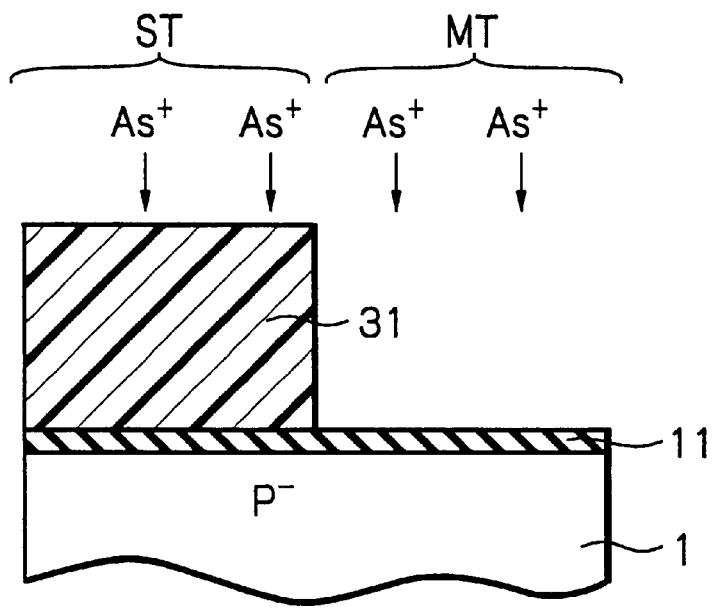
FIGS. 9A through 9H are cross-sectional views for explaining a fourth embodiment of the method for manufacturing a nonvolatile semiconductor memory device according to the present invention.

First, referring to FIG. 9A, after a field silicon oxide layer (not shown) is grown on a P$^-$-type silicon substrate 1 by a LOCOS process, an about 20 nm thick through silicon oxide layer 11 is thermally grown by oxidizing the silicon substrate 1. Then, a photoresist pattern 31 is formed only on the area of the selection transistor ST. Then, $3\times10^{12}$ arsenic ions (As$^+$) per cm$^2$ are implanted at an energy of about 40 keV via the through silicon oxide layer 11 into the silicon substrate 1 by using the photoresist pattern 31 as a mask, in order to enhance the growth rate of silicon oxide on the area of the memory transistor MT. Then, the photoresist pattern 31 and the through silicon oxide layer 11 are removed.

Figure 9B:
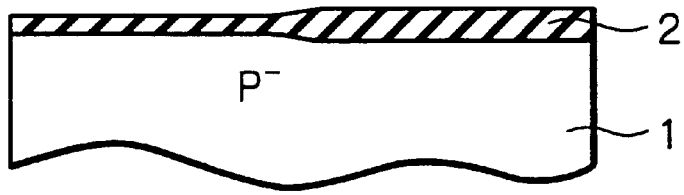

Next, referring to FIG. 9B, in a similar way to those of FIG. 7B, a gate silicon oxide layer (tunneling oxide layer) 2 is thermally grown by oxidizing the silicon substrate 1 at a temperature of about 850° C. In this case, the gate silicon oxide layer 2 is about 8 nm thick in the area of the memory transistor MT due to the implantation of arsenic into the silicon substrate 1. On the other hand, the gate silicon oxide layer 2 is about 6 nm thick in the area of the selection transistor ST.

Figure 9C:
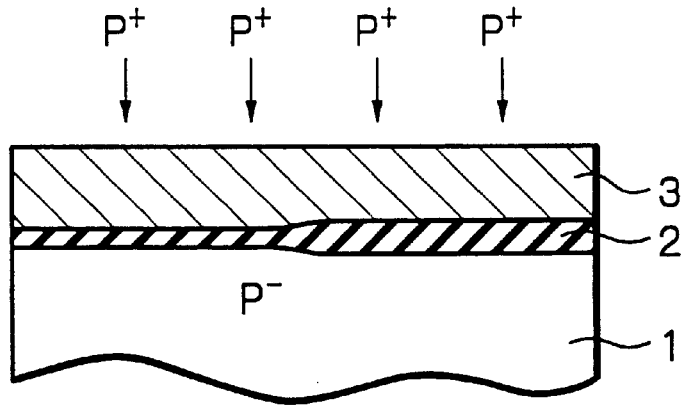

Next, referring to FIG. 9C, in the same way as in FIG. 7C, an about 150 nm thick polycrystalline silicon layer 3 is deposited on the gate silicon oxide layer 2 by a CVD process. Then, about $5\times10^{14}$ phosphorus ions (P$^+$) per cm$^2$ are implanted at an energy of about 40 keV into the polycrystalline silicon layer 3.

Figure 9D:
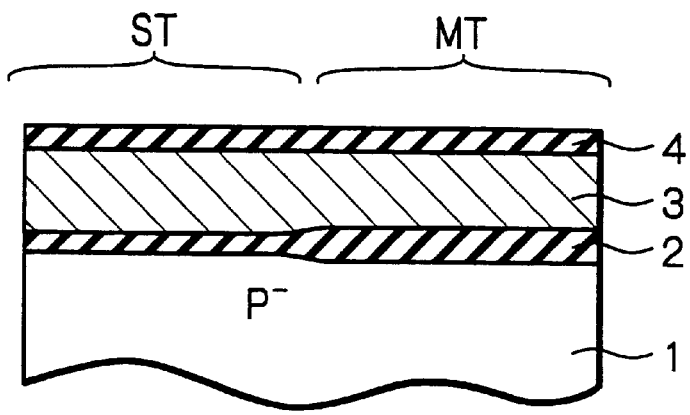

Next, referring to FIG. 9D, in the same way as in FIG. 7D, an insulating layer 4 made of ONO is deposited on the polycrystalline silicon layer 3 by a CVD process. In this case, the thickness of the insulating layer 4 corresponds to the thickness of about 17 nm of silicon oxide.

Figure 9E:
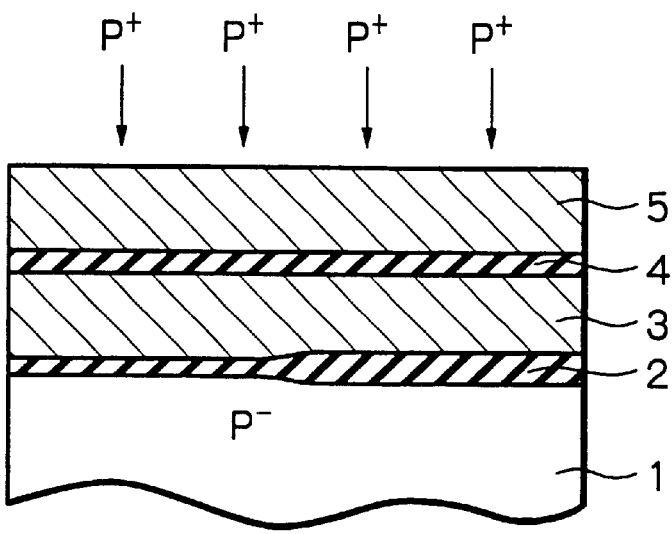

Next, referring to FIG. 9E, in the same way as in FIG. 7E, an about 150 nm thick polycrystalline silicon layer 5 is deposited on the insulating layer 4 by a CVD process. Then, phosphorus ions (P$^+$) are diffused into the polycrystalline silicon layer 5, so that the resistance at the polycrystalline silicon layer 5 is about 40 Ω/□.

Figure 9F:
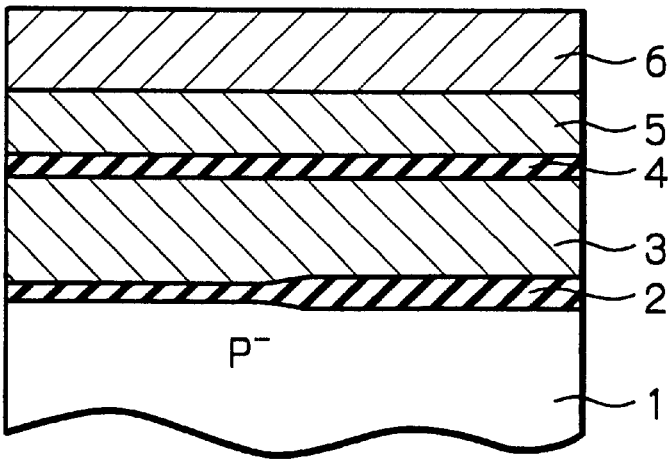

Next, referring to FIG. 9F, in the same way as in FIG. 7F, an about 150 nm thick WSi layer 6 is deposited on the polycrystalline silicon layer 5 by a sputtering process.

Figure 9G:
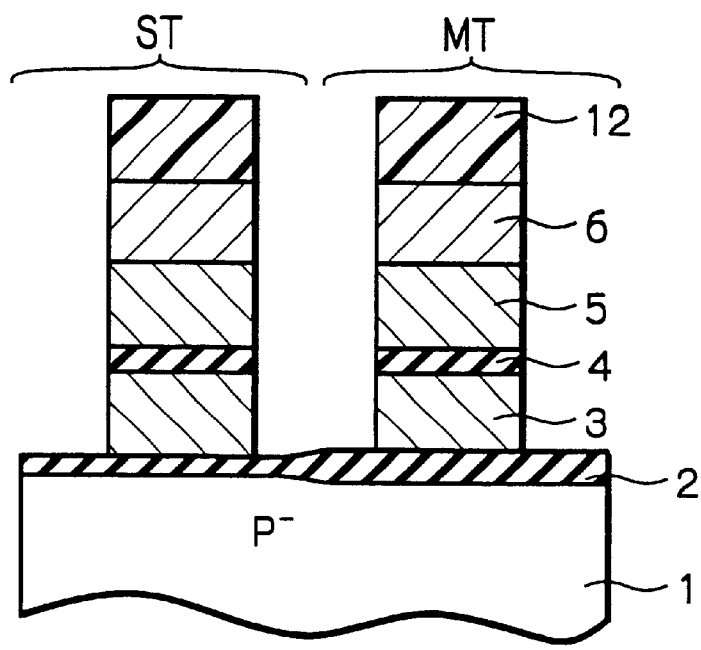

Next, referring to FIG. 9G, in the same way as in FIG. 7G, a photoresist pattern 12 is formed by a photolithography process. Then, the WSi layer 6, the polycrystalline silicon layer 5, the insulating layer 4 and the polycrystalline silicon layer 3 are sequentially etched by using the photoresist pattern 12 as a mask. Then, the photoresist pattern 12 is removed.

Figure 9H:
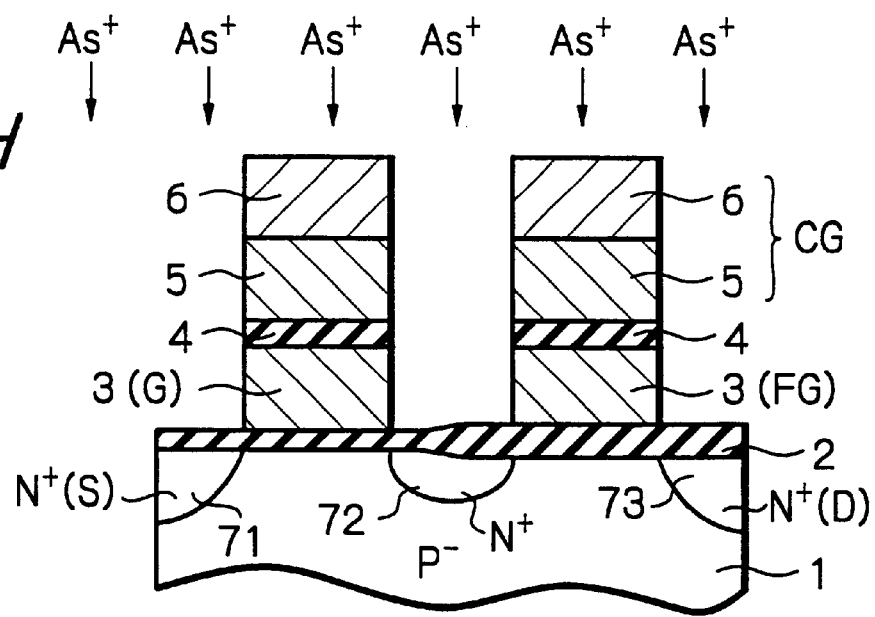

Finally, referring to FIG. 9H, in the same way as in FIG. 7H, N-type impurity ions such as phosphorus ions (P$^+$) or arsenic ions (As$^+$) are implanted via the gate silicon oxide layer 2 into the silicon substrate 1 in self-alignment with the patterned layers of the WSi layer 6, the polycrystalline silicon layer 5, the insulating layer 4 and the polycrystalline silicon layer 3 so that the impurity regions 71, 72 and 73 are formed within the silicon substrate 1, thus completing the device.

In the fourth embodiment as illustrated in FIGS. 9A through 9H, since the gate silicon oxide layer 2 has a reduced thickness for the selection transistor ST, it is possible for the gate silicon oxide layer 2 to be optimum both for the selection transistor ST and the memory transistor MT. In addition, the threshold voltage of the memory transistion MT is adjusted by the implantation of arsenic ions as illustrated in FIG. 9A.

A fifth embodiment of the method for manufacturing a nonvolatile semiconductor device according to the present invention will be explained next with reference to FIGS. 10A through 10I.

Figure 10A:
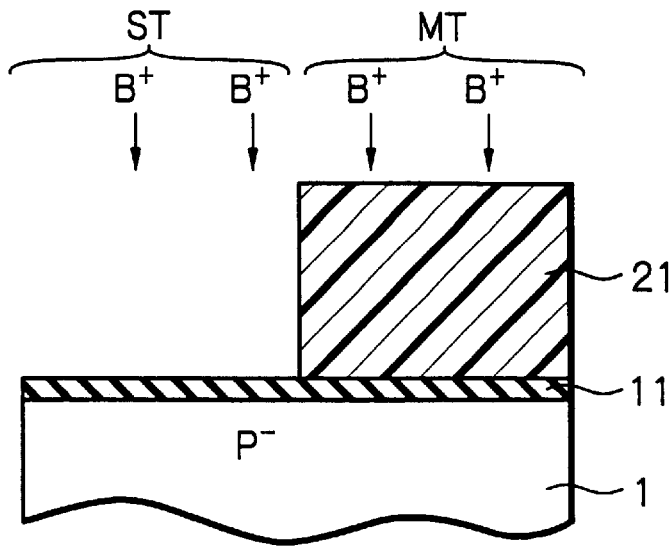
FIGS. 10A through 10I are cross-sectional views for explaining a fifth embodiment of the method for manufacturing a nonvolatile semiconductor memory device according to the present invention.

First, referring to FIG. 10A, in the same way as in FIG. 8A, after a field silicon oxide layer (not shown) is grown on a P$^-$-type silicon substrate 1 by a LOCOS process, an about 20 nm thick through silicon oxide layer 11 is thermally grown by oxidizing the silicon substrate 1. Then, a photoresist patter 21 is formed only on the area of the memory transistor MT. Then, $2\times10^{12}$ boron ions (B$^+$) per cm$^2$ are implanted at an energy of about 30 keV via the through silicon oxide layer 11 into the silicon substrate 1 by using the photoresist pattern 21 as a mask, in order to increase the threshold voltage of the selection transistor ST. Then, the photoresist pattern 12 is removed.

Figure 10B:
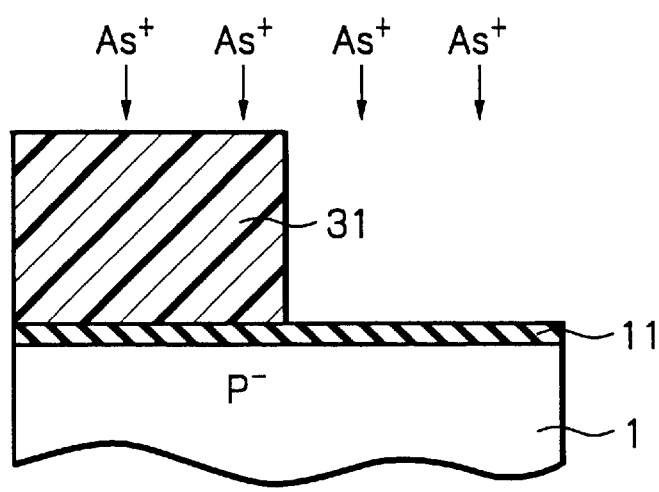

Next, referring to FIG. 10B, in the same way as in FIG. 9A, a photoresist pattern 31 is formed on the area of the selection transistor ST. Then, $3\times10^{12}$ arsenic ions (As$^+$) per cm$^2$ are implanted at an energy of about 40 keV via the through silicon oxide layer 11 into the silicon substrate 1 by using the photoresist pattern 31 as a mask, in order to enhance the growth rate of silicon oxide on the area of the memory transistor MT. Then, the photoresist pattern 31 and the through silicon oxide layer 11 are removed.

Note that the implantation of arsenic ions can be carried out before that of boron ions.

Figure 10C:
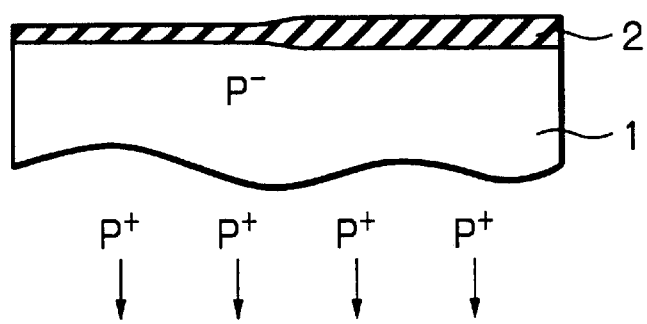

Next, referring to FIG. 10C, in the same way as in FIG. 8C, a gate silicon oxide layer (tunneling oxide layer) 2 is thermally grown by oxidizing the silicon substrate 1 at a temperature of about 850° C. In this case, the gate silicon oxide layer 2 is about 8 nm thick in the area of the memory transistor MT due to the implantation of arsenic into the silicon substrate 1. On the other hand, the gate silicon oxide layer 2 is about 6 nm thick in the area of the selection transistor ST.

Figure 10D:
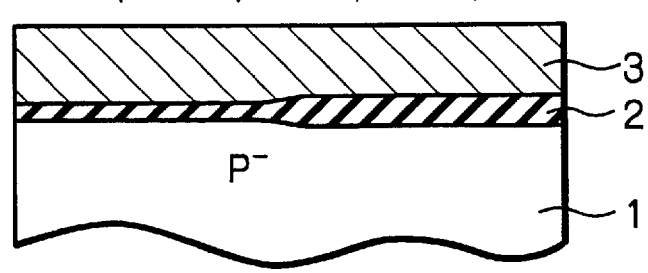

Next, referring to FIG. 10D, in the same way as in FIG. 8D, an about 150 nm thick polycrystalline silicon layer 3 is deposited on the gate silicon oxide layer 2 by a CVD process. Then, about $5\times10^{14}$ phosphorus ions (P$^+$) per cm$^2$ are implanted at an energy of about 40 keV into the polycrystalline silicon layer 3.

Figure 10E:
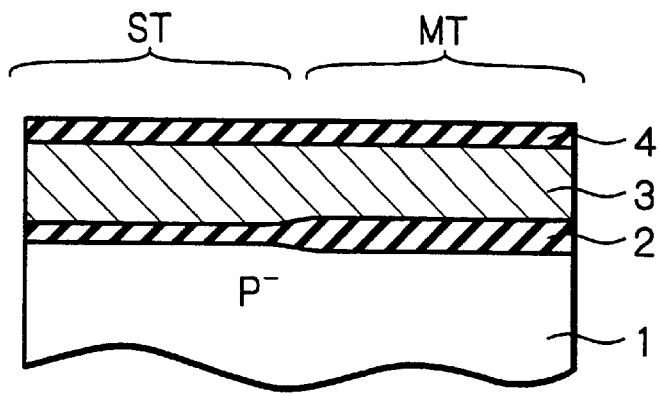

Next, referring to FIG. 10E, in the same way as in FIG. 8E, an insulating layer 4 made of ONO is deposited on the polycrystalline silicon layer 3 by a CVD process. In this case, the thickness of the insulating layer 4 corresponds to the thickness of about 17 nm of silicon oxide.

Figure 10F:
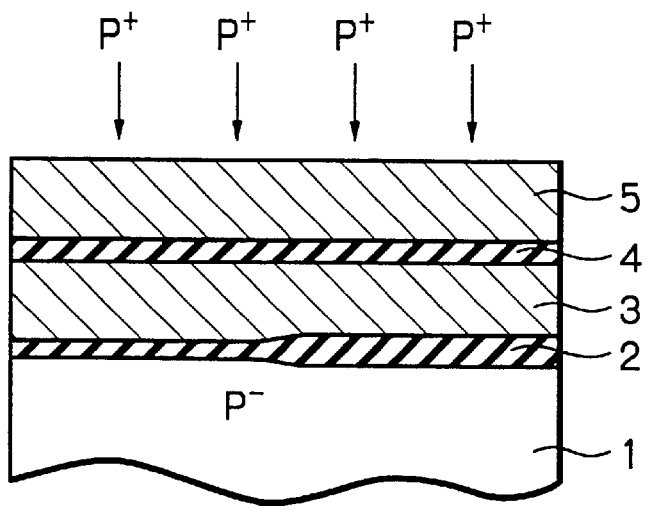

Next, referring to FIG. 10F, in the same way as in FIG. 8F, an about 150 nm thick polycrystalline silicon layer 5 is deposited on the insulating layer 4 by a CVD process. Then, phosphorus ions (P$^+$) are diffused into the polycrystalline silicon layer 5, so that the resistance at the polycrystalline silicon layer 5 is about 40 Ω/□.

Figure 10G:
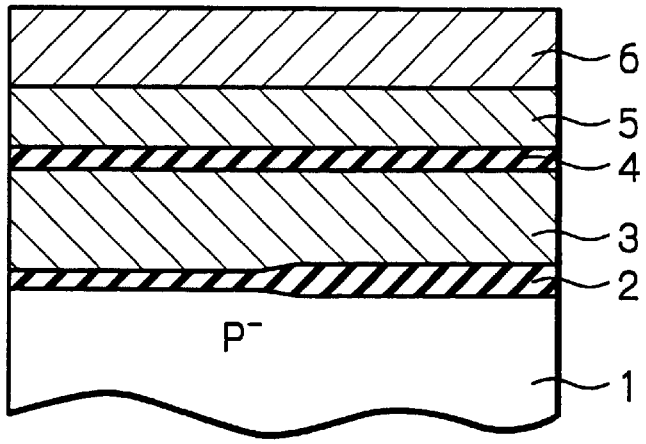

Next, referring to FIG. 10G, in the same way as in FIG. 8G, an about 150 nm thick WSi layer 6 is deposited on the polycrystalline silicon layer 5 by a sputtering process.

Figure 10H:
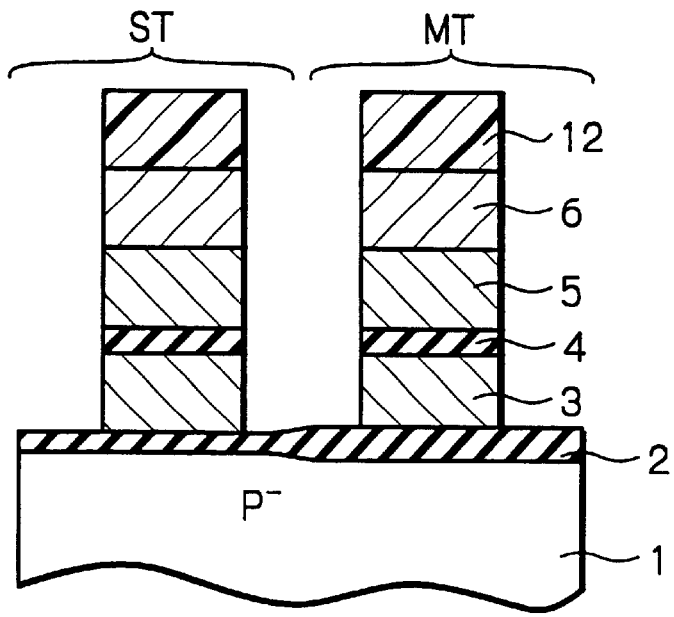

Next, referring to FIG. 10H, in the same way as in FIG. 8H, a photoresist pattern 12 is formed by a photolithography process. Then, the WSi layer 6, the polycrystalline silicon layer 5, the insulating layer 4 and the polycrystalline silicon layer 3 are sequentially etched by using the photoresist pattern 12 as a mask. Then, the photoresist pattern 12 is removed.

Figure 10I:
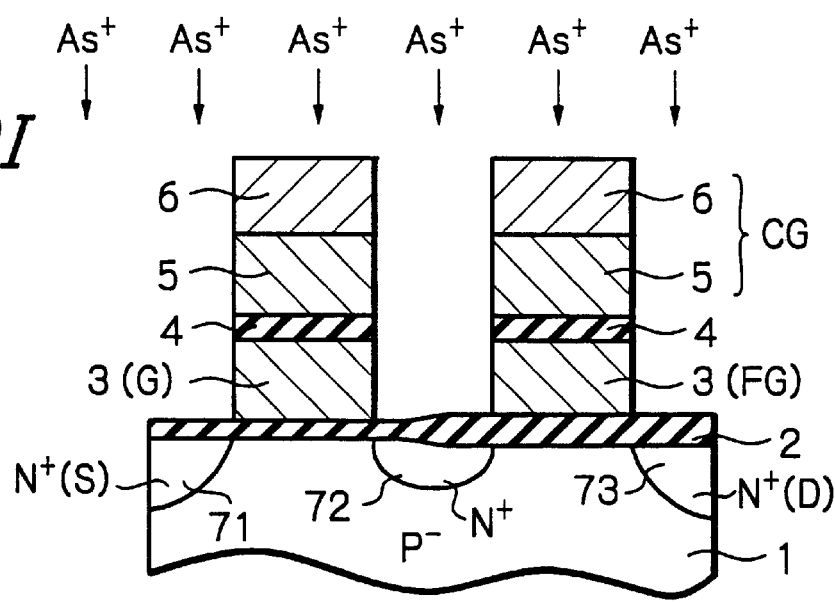

Finally, referring to FIG. 10I, in the same way as in FIG. 8I, N-type impurity ions such as phosphorus ions (P$^+$) or arsenic ions (As$^+$) are implanted via the gate silicon oxide layer 2 into the silicon substrate 1 in self-alignment with the patterned layers of the WSi layer 6, the polycrystalline silicon layer 5, the insulating layer 4 and the polycrystalline silicon layer 3 so that the impurity regions 71, 72 and 73 are formed within the silicon substrate 1, thus completing the device.

In the fifth embodiment as illustrated in FIGS. 10A through 10I, since the gate silicon oxide layer 2 has a reduced thickness for the selection transistor ST, it is possible for the gate silicon oxide layer 2 to be optimum for both the selection transistor ST and the memory transistor MT.

In addition, since the implantation of impurity ions for increasing the threshold voltages as illustrated in FIG. 8A is carried out only for the selection transistor ST and the implantation of impurity ions for decreasing the threshold voltages as illustrated in FIG. 10B is carried out only for the memory transistor MT, it is possible to adjust the threshold voltage of the memory transistor MT independent of the threshold voltage of the selection transistor ST. In this case, since arsenic ions with no boron ions are injected into the silicon substrate 1 in the area of the memory transistor MT, the threshold voltage of the memory transistor MT where no electrons are injected into the floating gate FG can be small, thus avoiding the read disturb phenomenon.

In the above-described embodiments, the selection transistor ST and the memory transistor MT are both of an N-channel type; however, the present invention can be applied to a selection transistor and a memory transistor of a P-channel type. In this case, the silicon substrate 1 is of an N$^-$-type, about $2\times10^{12}$ phosphorus ions per cm$^2$ at an energy of about 40 keV are implanted into the silicon substrate 1 at a step as illustrated in FIGS. 6A, 7A, 8A, 9A and 10A, and boron ions are implanted into the silicon substrate 1 to form the impurity regions 7-1, 7-2 and 7-3 within the silicon substrate 1.

As explained hereinabove according to the present invention, the thickness of a gate insulating layer can be optimum both for a selection transistor and a memory transistor. In addition, the threshold voltage of the memory transistor can be adjusted, thus avoiding the read disturb phenomenon.

What is claimed is:

1. A method for manufacturing a nonvolatile semiconductor memory device including a plurality of memory cells each formed by one selection transistor and one memory transistor connected in series, comprising the steps of:

forming a photoresist pattern on a silicon substrate in a memory transistor forming area;

implanting first impurity ions for suppressing the rate of oxide grown on said silicon substrate using said photoresist pattern as a mask;

removing said photoresist pattern after said first impurity ions are implanted;

thermally growing a silicon oxide layer on said silicon substrate so that said silicon oxide layer is thinner in a selection transistor forming area than in said memory transistor forming area, after said photoresist pattern is removed;

forming a first conductive layer on said silicon oxide layer;

forming an insulating layer on said first conductive layer;

forming a second conductive layer on said insulating layer; and patterning said second conductive layer, said insulating layer and said first conductive layer, a threshold voltage of said memory transistor being adjusted independently of a threshold voltage of said selection transistor.

2. The method as set forth in claim 1, wherein said first impurity ions are nitrogen ions.

3. A method for manufacturing a nonvolatile semiconductor memory device including a plurality of memory cells each formed by one selection transistor and one memory transistor connected in series, comprising the steps of:

forming a photoresist pattern on a silicon substrate in a memory transistor forming area;

implanting first impurity ions for suppressing the rate of oxide grown on said silicon substrate using said photoresist pattern as a mask;

removing said photoresist pattern after said first impurity ions are implanted;

thermally growing a silicon oxide layer on said silicon substrate so that said silicon oxide layer is thinner in a selection transistor forming area than in said memory transistor forming area, after said photoresist pattern is removed;

forming a first conductive layer on said silicon oxide layer;

forming an insulating layer on said first conductive layer;

forming a second conductive layer on said insulating layer; and patterning said second conductive layer, said insulating layer and said first conductive layer, and further comprising a step of implanting second impurity ions for adjusting a threshold voltage of said selection transistor using said photoresist pattern as a mask.

4. The method as set forth in claim 3, wherein said silicon substrate is of a P-type, and said second impurity ions are boron ions.

5. The method as set forth in claim 3, wherein said silicon substrate is of an N-type, and said second impurity ions are arsenic ions.

6. A method for manufacturing a nonvolatile semiconductor memory device including a plurality of memory cells each formed by one selection transistor and one memory transistor connected in series, comprising the steps of:

forming a first photoresist pattern on a silicon substrate in a selection transistor forming area;

implanting first impurity ions for enhancing the rate of oxide grown on said silicon substrate using said first photoresist pattern as a mask;

removing said first photoresist pattern after said first impurity ions are implanted;

thermally growing a silicon oxide layer on said silicon substrate so that said silicon oxide layer is thinner in said selection transistor forming area than in a memory transistor forming area, after said first photoresist pattern is removed;

forming a first conductive layer on said silicon oxide layer;

forming an insulating layer on said first conductive layer;

forming a second conductive layer on said insulating layer; and patterning said second conductive layer, said insulating layer and said first conductive layer.

7. The method as set forth in claim 6, wherein said first impurity ions are arsenic ions.

8. The method as set forth in claim 6, further comprising the step of:

forming a second photoresist pattern on said silicon substrate in said memory transistor forming area; and implanting second impurity ions for adjusting a threshold voltage of said selection transistor using said second photoresist pattern as a mask.

9. The method as set forth in claim 8, wherein said silicon substrate is of a P-type, and said second impurity ions are boron ions.

10. The method as set forth in claim 8, wherein said silicon substrate is of an N-type, and said second impurity ions are arsenic ions.

11. A method for manufacturing a nonvolatile semiconductor memory device including a plurality of memory cells each formed by one selection transistor and one memory transistor connected in series, comprising the steps of:

forming a photoresist pattern on a silicon substrate in a memory transistor forming area;

implanting impurity ions for adjusting a threshold voltage of said selection transistor using said photoresist pattern as a mask;

removing said photoresist pattern after said impurity ions are implanted;

thermally growing a silicon oxide layer on said silicon substrate, after said photoresist pattern is removed;

forming a first conductive layer on said silicon oxide layer;

forming an insulating layer on said first conductive layer;

forming a second conductive layer on said insulating layer; and patterning said second conductive layer, said insulating layer and said first conductive layer, a threshold voltage of said memory transistor being adjusted independently of a threshold voltage of said selection transistor.

12. The method as set forth in claim 11, wherein said silicon substrate is of a P-type, and said impurity ions are boron ions.

13. A method for manufacturing a nonvolatile semiconductor memory device including a plurality of memory cells each formed by one selection transistor and one memory transistor connected in series, comprising the steps of:

forming a photoresist pattern on a silicon substrate in a memory transistor forming area;

implanting impurity ions for adjusting a threshold voltage of said selection transistor using said photoresist pattern as a mask;

removing said photoresist pattern after said first impurity ions are implanted;

thermally growing a silicon oxide layer on said silicon substrate, after said photoresist pattern is removed;

forming a first conductive layer on said silicon oxide layer;

forming an insulating layer on said first conductive layer;

forming a second conductive layer on said insulating layer; and patterning said second conductive layer, said insulating layer and said first conducive layer, wherein said silicon substrate is of an N-type, and said impurity ions are arsenic ions.

* * * * *